United States Patent
Woo et al.

(10) Patent No.: US 8,008,976 B2
(45) Date of Patent: Aug. 30, 2011

(54) HIGH-EFFICIENCY POWER AMPLIFICATION APPARATUS USING SATURATED OPERATION AND METHOD FOR CONTROLLING THE SAME

(75) Inventors: Young-Yun Woo, Suwon-si (KR); Bum-Man Kim, Pohang-si (KR); Jang-Heon Kim, Pohang-si (KR); Cheol-Soo Seo, Suwon-si (KR); Jung-Hwan Moon, Pohang-si (KR); Jung-Joon Kim, Pohang-si (KR)

(73) Assignees: Samsung Electronics Co., Ltd., Suwon-si (KR); Postech Academy Industry Foundation, Gyeongsangbuk-do (KR)

( * ) Notice: Subject to any disclaimer, the term of this patent is extended or adjusted under 35 U.S.C. 154(b) by 0 days.

(21) Appl. No.: 12/387,366

(22) Filed: May 1, 2009

(65) Prior Publication Data

US 2010/0188153 A1 Jul. 29, 2010

(51) Int. Cl.
*H03F 3/04* (2006.01)
(52) U.S. Cl. .................................... 330/302; 330/277
(58) Field of Classification Search ............. 330/305, 330/277, 302, 285
See application file for complete search history.

(56) References Cited

U.S. PATENT DOCUMENTS 5,942,943 A * 8/1999 Matsuno ............... 330/302
6,462,622 B1 * 10/2002 Mori et al. ............ 330/302

* cited by examiner

*Primary Examiner* — Hieu P Nguyen

(57) ABSTRACT

A saturated power amplification apparatus and a method for controlling the same are provided, in which a power device is provided, and an output matcher matches a load impedance of the power device. The load impedance is a complex impedance exceeding an impedance generated during power matching in the saturated power amplification apparatus.

18 Claims, 12 Drawing Sheets

HIGH-EFFICIENCY POWER AMPLIFICATION APPARATUS USING SATURATED OPERATION AND METHOD FOR CONTROLLING THE SAME

CROSS-REFERENCE TO RELATED APPLICATION(S) AND CLAIM OF PRIORITY

This application claims the benefit under 35 U.S.C. §119 (a) of a Korean Patent Application filed in the Korean Intellectual Property Office on Jan. 23, 2009 and assigned Serial No. 10-2009-0006210, the entire disclosure of which is hereby incorporated by reference.

TECHNICAL FIELD OF THE INVENTION

The present invention generally relates to a high-efficiency power amplification apparatus and a method for controlling the same. More particularly, the present invention relates to a high-efficiency power amplification apparatus using saturated operation and a method for controlling the same.

BACKGROUND OF THE INVENTION

If a mobile communication system operates in the manner that increases the signal efficiency of a frequency band, such as in Code Division Multiple Access (CDMA), Wideband CDMA (WCDMA), Worldwide Interoperability for Microwave Access (WiMAX), or Long Term Evolution (LTE), it should use a complex modulated signal in order to increase signal efficiency in a given frequency band. This complex modulated signal is a non-constant envelope signal with a relatively high Peak-to-Average Power Ratio (PAPR). Linearity is a very critical factor to the non-constant envelope signal. Accordingly, the mobile communication system should amplify a signal, while maintaining high linearity and high efficiency.

Although the high linearity is maintained by use of a low-efficiency power amplification apparatus, heat is generated due to the low efficiency. Therefore, the mobile communication system should be equipped with a relatively large, unnecessary cooling system to reduce the heat. However, the cooling system brings an increase in size and cost to each of a Base Station (BS), a repeater, and a Mobile Station (MS) in the mobile communication system. In this context, active research is conducted on a high-efficiency power amplification apparatus that maintains high linearity and high efficiency for the CDMA, WCDMA, WiMAX, or LTE mobile communication system.

Major high-efficiency power amplification apparatuses include Class-E, inverse Class-E, Class-D, and inverse Class-D ones. These power amplification apparatuses commonly achieve high efficiency through switching of a power device.

However, the Class-E, inverse Class-E, Class-D, and inverse Class-D power amplification apparatuses are not capable of zero-voltage switching because of parasitic harmonics and the large output capacitance of a high-output power device. As a consequence, it is difficult to implement the power amplification apparatuses with packaged power devices.

Other major high-efficiency power amplification apparatuses are Class-F and inverse Class-F ones. The Class-F and inverse Class-F power amplification apparatuses offer high efficiency through harmonic control. Yet, the high efficiency is not achieved easily because of the difficulty in the harmonic control of a current source of a power device simultaneous with compensation of the output capacitance of the power device. Moreover, a complex harmonic control circuit and a fundamental frequency matching circuit are essential for real implementation of the Class-F and inverse Class-F power amplification apparatuses.

As described above, real implementation of high-efficiency power amplification apparatuses proposed to date is difficult because an additional circuit is needed, for example, a harmonic control circuit is needed for the Class-F and inverse Class-F power amplification apparatuses.

Accordingly, there exists a need for a high-efficiency power amplification apparatus for achieving high efficiency without an additional circuit.

SUMMARY OF THE INVENTION

To address the above-discussed deficiencies of the prior art, it is a primary object of the present invention to address at least the problems and/or disadvantages and to provide at least the advantages described below. Accordingly, an aspect of exemplary embodiments of the present invention is to provide a high-efficiency power amplification apparatus using a saturated operation and a method for controlling the same.

In accordance with an aspect of exemplary embodiments of the present invention, there is provided a saturated power amplification apparatus, in which a power device is provided, and an output matcher matches a load impedance of the power device. The load impedance is a complex impedance exceeding an impedance generated during power matching in the saturated power amplification apparatus.

In accordance with another aspect of exemplary embodiments of the present invention, there is provided a method for controlling a saturated power amplification apparatus wherein a load impedance of a power device is matched. The load impedance is a complex impedance exceeding an impedance generated during power matching in the saturated power amplification apparatus.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged power amplification apparatus.

The matters defined in the description such as a detailed construction and elements are provided to assist in a comprehensive understanding of exemplary embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Exemplary embodiments of the present invention provide a high-efficiency power amplification apparatus using a saturated operation and a method for controlling the same. For notational simplicity, the high-efficiency power amplification apparatus using a saturated operation is referred to as a "saturated power amplification apparatus".

Figure 1:
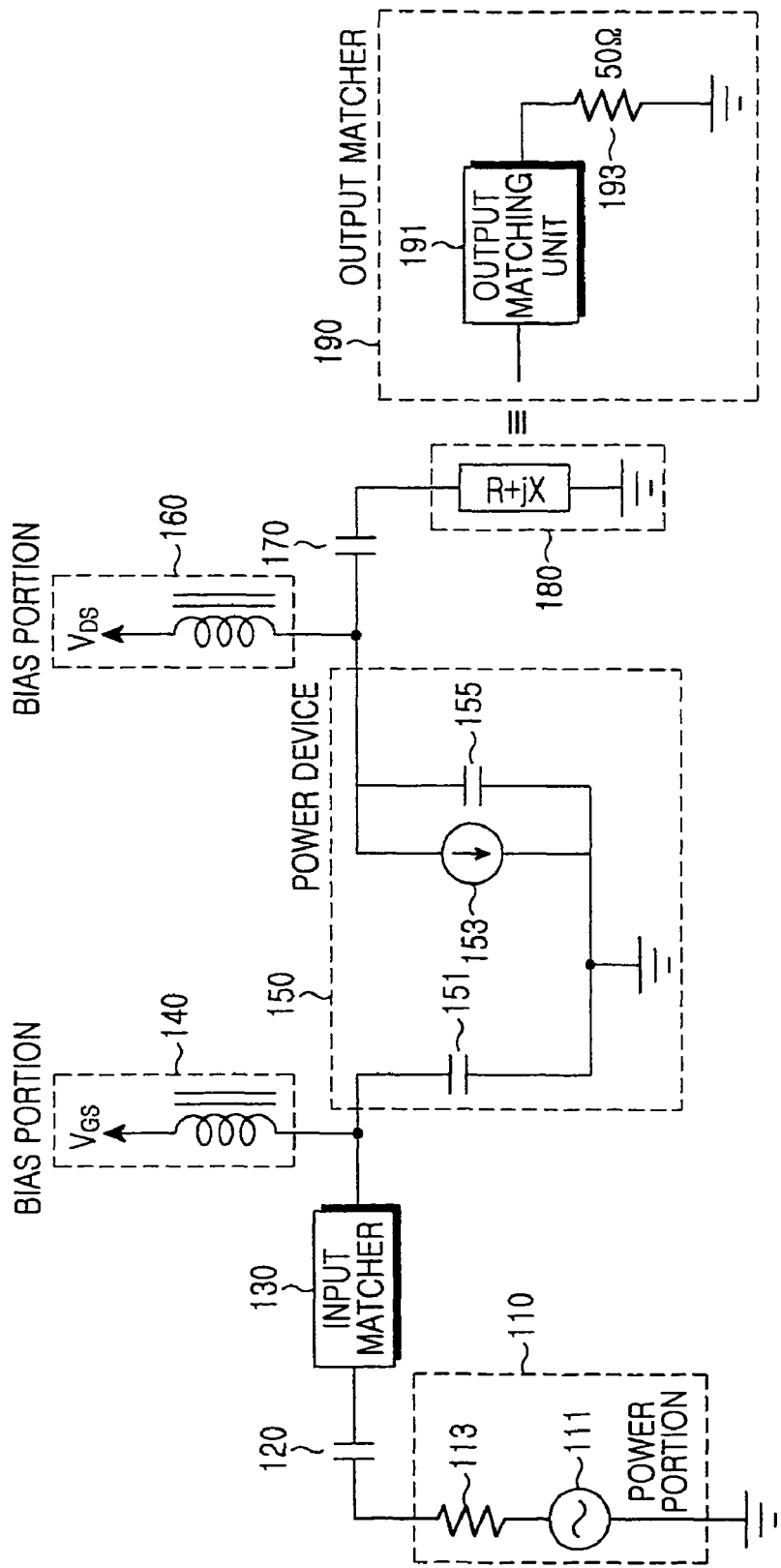
FIG. 1 is a circuit diagram of a saturated power amplification apparatus according to an exemplary embodiment of the present invention.

FIG. 1 is a circuit diagram of a saturated power amplification apparatus according to an exemplary embodiment of the present invention.

Referring to FIG. 1, the saturated power amplification apparatus includes a power portion 110, a capacitor 120, an input matcher 130, a bias portion 140, a power device 150, a bias portion 160, a capacitor 170, and an impedance 180. The power portion 110 has a power source 111 and a resistor 113. The power device 150 has a capacitor 151, a current source 153, and a capacitor 155. The impedance 180 is equivalent to an output matcher 190. The output matcher 190 includes an output matching unit 191 and an impedance 193.

The power portion 110 supplies power to the power device 150. For power supply with minimal loss, the input matcher 130 matches an input impedance. For example, the power device 150 can be a MOSFET.

The bias portion 140 is connected to a gate end of the power device 150 for providing a bias to the power device 150. The bias portion 160 is connected to a drain end of the power device 150, for providing a bias to the power device 150.

The impedance 180 is a complex load impedance R+jX. The complex impedance R+jX is the result from matching an output termination impedance, i.e. the impedance 193 through the output matching unit 191. For example, the output termination impedance can be 50 Ω. The magnitude sqrt $(R^2+X^2)$ of the complex impedance R+jX should be set to be larger than an optimal impedance $R_{opt}$, which will be described in detail herein below. The reason for setting sqrt $(R^2+X^2)$ larger than $R_{opt}$ is to increase a voltage waveform. The phase $\tan^{-1}(X/R)$ of the complex impedance R+jX should be set such that the phase difference between a second harmonic voltage generated through an output capacitor, i.e., the capacitor 155 and a fundamental-frequency voltage generated using the complex impedance R+jX is a predetermined angle, for example, 180°. Also, the phase $\tan^{-1}(X/R)$ of the complex impedance R+jX should be set such that a load line created using the complex impedance R+jX can generate a large amount of harmonic current. Therefore, the phase $\tan^{-1}(X/R)$ of the complex impedance R+jX should be set so that the saturated power amplification apparatus extends its operation region to a knee region as well as to a linear region on a DC I-V characteristic curve and, thus, generates a large amount of harmonic current. The linear region and the knee region will be described in detail herein below. The DC I-V characteristic curve shows the relationship between drain-source current $I_{ds}$ as a function of gate-source voltage and drain-source voltage $V_{ds}$ (the y axis represents $I_{ds}$ and the x axis represents $V_{ds}$). DC I-V is a general term and, thus, its detailed description is not provided herein.

Here, a description will be made of the optimal impedance $R_{opt}$.

A power amplification apparatus typically outputs a maximum power by using the current and voltage of a power device in up to a maximum available range. To output the maximum power, the power amplification apparatus should perform power matching at its output end. The power matching is a control operation in the design phase of the power amplification apparatus in order to enable the power amplification apparatus to output the maximum power of the power device. An impedance that is generated when the power matching operation is performed is the optimal impedance $R_{opt}$ given by Equation 1:

$$R_{opt} = \frac{V_1}{I_1}. \quad [\text{Eqn. 1}]$$

In Equation 1, $V_1$ denotes a fundamental-frequency voltage and $I_1$ denotes a fundamental-frequency current.

As described above, the optimal impedance $R_{opt}$ is determined according to the characteristics of the power device. Thus, it is typical to design a power amplification apparatus by converting a 50 Ω impedance to the optimal impedance $R_{opt}$ through the output matching unit. The 50 Ω impedance is converted to the optimal impedance $R_{opt}$ because communication systems generally use 50 Ω. The output power and efficiency of the power amplification apparatus are determined as a bias level changes from Class-A to Class-C. The bias level-based optimal impedance $R_{opt}$ is computed by Equation 2:

$$R_{opt} = \frac{V_1}{I_1} = \frac{V_{dc}}{I_1(\alpha)}. \quad [\text{Eqn. 2}]$$

In Equation 2, α denotes the conduction angle of the power amplification apparatus.

On the assumption of short impedance for all harmonics, the fundamental-frequency voltage $V_1$-becomes equal to $V_{dc}$ and $I_1$ varies with the conduction angle, i.e., the class of the power amplification apparatus. For instance, the class of the power amplification apparatus is Class-A for a conduction angle of 2π, Class-B for a conduction angle between 2π and π, Class-AB for a conduction angle of π, and Class-C for a conduction angle below π.

Therefore, $I_1(\alpha)$ described in Equation 2 is expressed by Equation 3:

$$I_1(\alpha) = \frac{I_{max}}{2\pi} \cdot \frac{\alpha - \sin\alpha}{1 - \cos\frac{\alpha}{2}}. \quad [\text{Eqn. 3}]$$

In Equation 3, $I_{max}$ denotes a maximum available current of the power amplification apparatus.

In general, a Class-AB power amplification apparatus is popular and its maximum efficiency is about 50% to 55% at a maximum power level. Yet, there is a continuous need for a power amplification apparatus having a higher efficiency than the Class-AB one. Thus, an inverse Class-F power amplification apparatus has been proposed as a high-efficiency power amplification apparatus. The inverse Class-F power amplification apparatus is ideal in that it achieves high efficiency with a half-sinusoidal drain voltage waveform and a rectangular drain current waveform on its DC I-V curve. The high efficiency is possible as the inverse Class-F power amplification apparatus ideally operates without regions having both non-zero current and non-zero voltage. The drain voltage waveform and the drain current waveform are given by Equations 4 and 5:

$$V(\theta) = V_{max} \cdot \left( \frac{1}{\pi} - \frac{1}{2} \cdot \cos\theta + \frac{2}{3\pi} \cdot \cos2\theta - \frac{2}{15\pi} \cdot \cos4\theta \ldots \right). \quad [\text{Eqn. 4}]$$

$$I(\theta) = I_{max} \cdot \left( \frac{1}{2} + \frac{2}{\pi} \cdot \cos\theta - \frac{2}{3\pi} \cdot \cos3\theta + \frac{2}{15\pi} \cdot \cos5\theta \ldots \right). \quad [\text{Eqn. 5}]$$

As noted from Equation 4 and Equation 5, the voltage waveform includes DC, the fundamental frequency, and harmonics, whereas the current waveform includes the DC, the fundamental frequency, and odd harmonics. Therefore, each harmonic impedance of the inverse Class-F power amplification apparatus designed to operate in a linear operation region should be designed as defined by Equation 6:

$$Z_{even} = \frac{V_{even}}{I_{even}} = \frac{V}{0} = \infty. \quad [\text{Eqn. 6}]$$

In Equation 6, $Z_{even}$ denotes the impedance of an even harmonic, $V_{even}$ denotes the voltage of the even harmonic, and $I_{even}$ denotes the current of the even harmonic.

$$Z_{odd} = \frac{V_{odd}}{I_{odd}} \approx \frac{0}{I} = 0. \quad [\text{Eqn. 7}]$$

In Equation 7, $Z_{odd}$ denotes the impedance of an odd harmonic, $V_{odd}$ denotes the voltage of the odd harmonic, and $I_{odd}$ denotes the current of the odd harmonic.

The implementation of an ideal inverse Class-F power amplification apparatus requires a unit for controlling harmonics of up to infinite order. It is almost impossible to implement this unit because of its very high implementation complexity. However, considering that lower harmonics affect more the output of the power amplification apparatus, the ideal inverse Class-F power amplification apparatus can be realized with a unit for controlling second and third harmonics that are controllable practically. The load impedances of the inverse Class-F power amplification apparatus capable of controlling second and third harmonics are a real-valued optimal impedance $R_{opt}$ for the fundamental frequency; a real-valued open impedance for the second harmonic; and a real-valued short impedance for the third harmonic.

Figure 2:
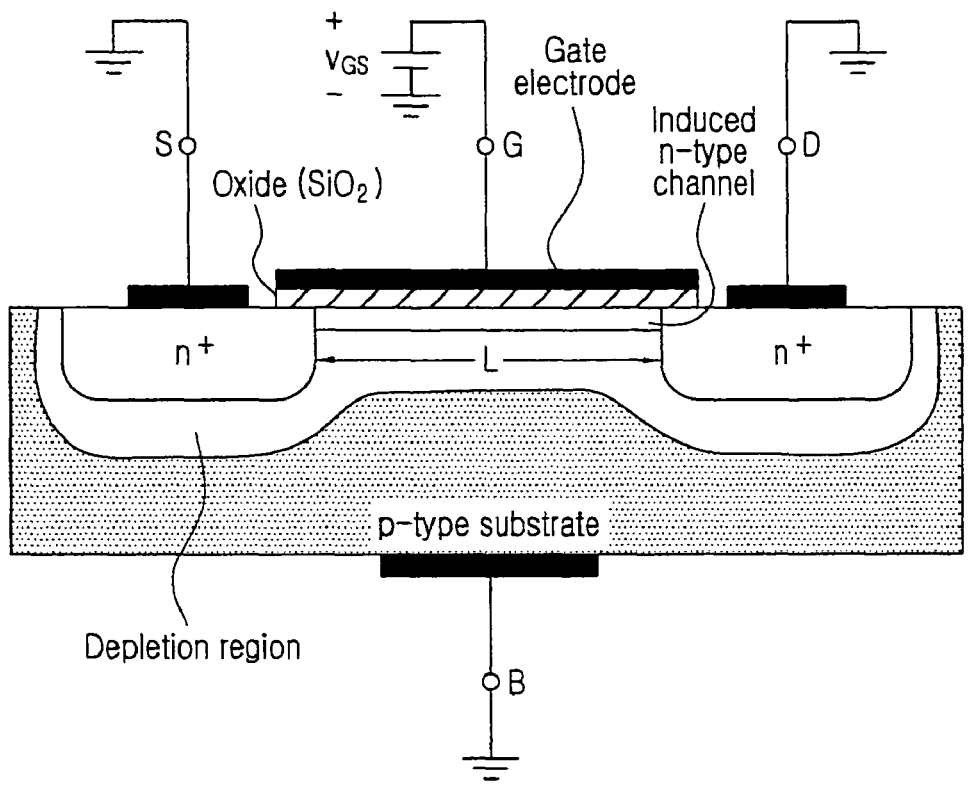
FIG. 2 illustrates the structure of a Metal-Oxide Semiconductor Field Effect Transistor (MOSFET) according to an exemplary embodiment of the present invention.
Figure 3:
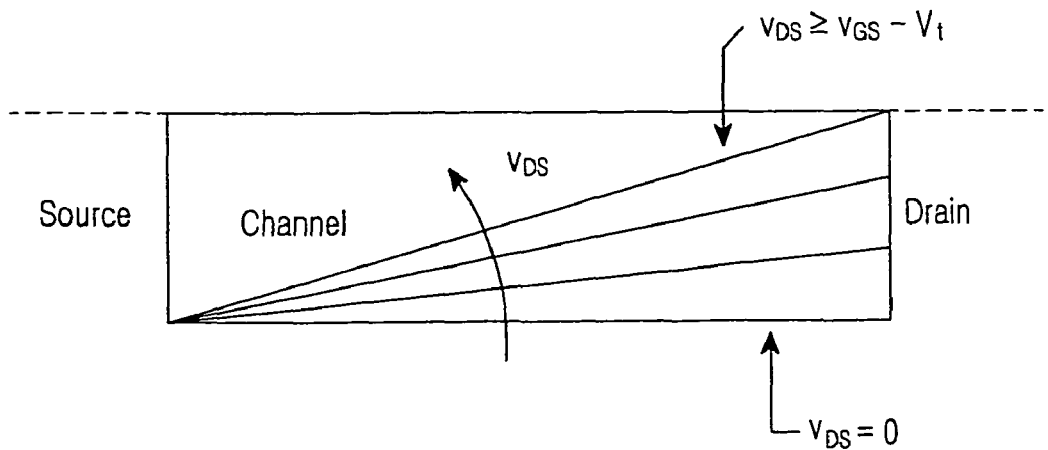
FIG. 3 illustrates a channel transformation when a drain bias increases in the MOSFET according to an exemplary embodiment of the present invention.
Figure 4:
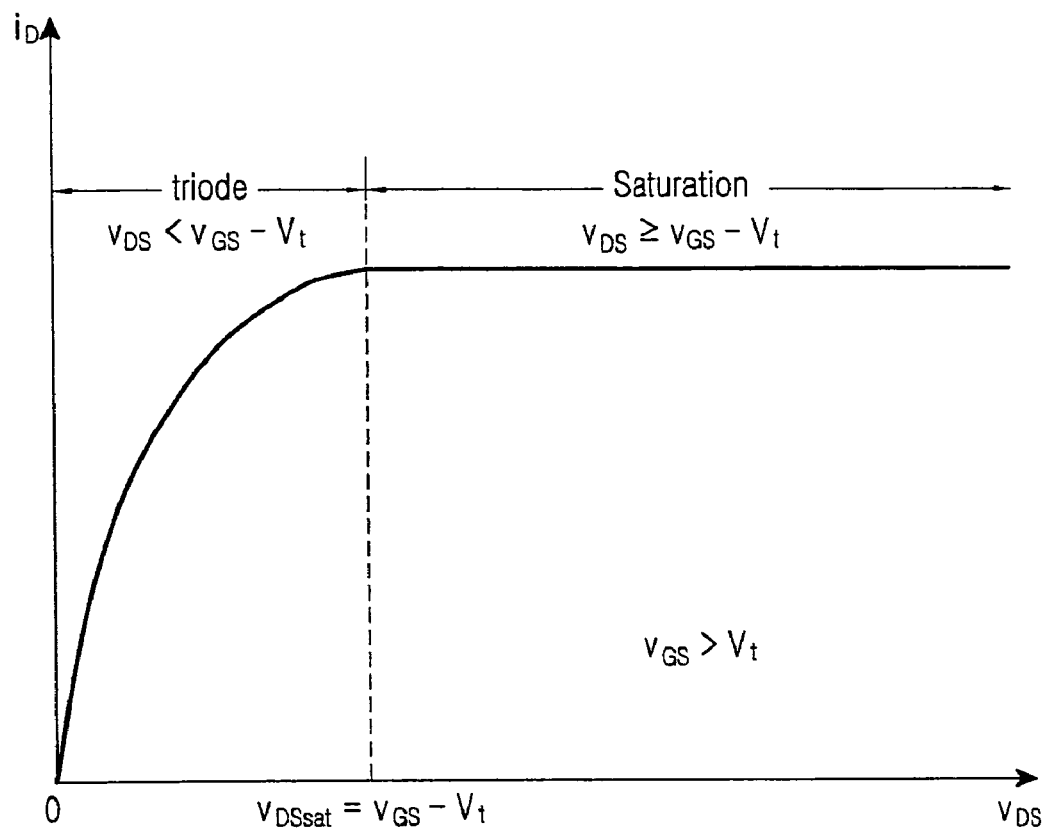
FIG. 4 is a graph illustrating drain current versus drain-source voltage in the MOSFET according to an exemplary embodiment of the present invention.

With reference to FIGS. 2, 3 and 4, the linear region will be described.

FIG. 2 illustrates the structure of a MOSFET; FIG. 3 illustrates a channel transformation when drain bias increases in the MOSFET; and FIG. 4 is a graph illustrating drain current versus drain-source voltage in the MOSFET.

Referring to FIG. 2, the MOSFET is used as a power device in a power amplification apparatus. Because the MOSFET illustrated in FIG. 2 is an N-channel MOS (NMOS), when a positive (+) bias is applied to a gate, free holes are repelled from a substrate region under the gate. The resulting carrier depletion region is populated by bound negative charge. As electrons are induced from an N+ drain region and a source region into a channel region, the drain is connected up to the source through the channel, thus allowing current to flow.

A voltage at which the current starts to flow through the channel is a threshold voltage. When drain bias gradually increases, the channel width gets non-uniform across the entire channel. Eventually, the channel width is approximately zero (0) at the drain end. This state is called pinch-off.

In the pinch-off state, even though the drain bias increases, a constant drain current flows irrespective of the channel in theory. The region without pinch-off is known as a triode region and the region where a drain bias equal to or greater than a pinch-off voltage is applied is known as a saturation region. The triode region of the MOSFET corresponds to the saturation region of a Bipolar Junction Transistor (BJT) and the saturation region of the MOSFET corresponds to the active region of the BJT.

Mathematically, in the event $v_{GS} \leq V_t$, where $V_{GS}$ is a gate-source voltage and $V_t$ is the threshold voltage, the channel is not created and, thus, the drain current is zero (0). In the event that $v_{GS} \geq V_t$ and $v_{DS} < v_{GS} - V_t$, where $v_{DS}$ is a drain-source voltage, the MOSFET operates in the triode region and, in the event $v_{GS} \geq V_t$ and $v_{DS} > v_{GS} - V_t$, the MOSFET operates in the saturation region. The drain current is expressed by Equation 8 in the former case and by Equation 9 in the latter case.

$$i_D = \mu_n C_{ox}\left(\frac{W}{L}\right)\left[(v_{GS} - V_t)v_{DS} - \frac{1}{2}v_{DS}^2\right]. \quad \text{[Eqn. 8]}$$

$$i_D = \frac{1}{2}\mu_n C_{ox}\left(\frac{W}{L}\right) \cdot (v_{GS} - V_t)^2. \quad \text{[Eqn. 9]}$$

In Equation 8 and Equation 9, $\mu_n$ denotes the electron mobility of the channel, $C_{ox}$ denotes the capacitance between the gate and the channel, W denotes the area of the channel, and L denotes the length of the channel.

Typically, the power amplification apparatus uses a large signal. Hence, it uses the whole region of the MOSFET illustrated in FIG. 4. The above-described triode region corresponds to a knee region in the power amplification apparatus. The drain voltage does not lead to a constant current in the knee region, thereby making it difficult for the MOSFET to operate linearly.

In accordance with the present invention, setting the load impedance to the complex impedance R+jX extends the operation region of the power device to the knee region. The resulting generation of more harmonics brings a higher efficiency. That is, the load impedance is set to the complex impedance R+jX in order to extend the operation region of the saturated power amplification apparatus to the knee region and thus to increase its efficiency. As a result, the efficiency of the saturated power amplification apparatus reaches 70% or higher, which is a great improvement compared to an efficiency of 45% to 50% of a conventional power amplification apparatus.

Figure 5:
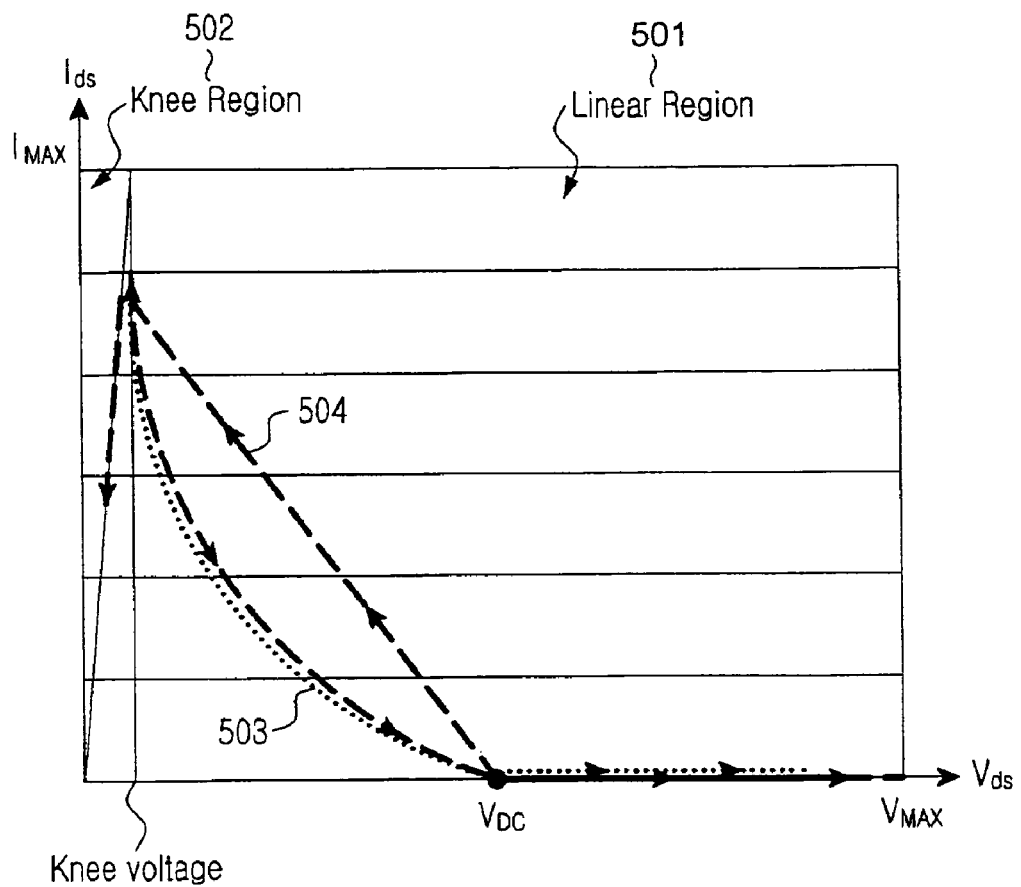
FIG. 5 is a graph comparing the saturated power amplification apparatus with a conventional inverse Class-F power amplification apparatus, in terms of load line, according to an exemplary embodiment of the present invention.

With reference to FIG. 5, the saturated power amplification apparatus of the present invention will be compared with a conventional inverse Class-F power amplification apparatus, in terms of load line.

FIG. 5 is a graph comparing the saturated power amplification apparatus of the present invention with a conventional inverse class-F power amplification apparatus in terms of load line.

Referring to FIG. 5, reference numeral 503 denotes the load line of the conventional inverse Class-F power amplification apparatus and reference numeral 504 denotes the load line of the saturated power amplification apparatus. The load line 503 indicates that the conventional inverse Class-F power amplification apparatus operates only in a linear region 501. In contrast, the load line 504 indicates that the saturated power amplification apparatus operates in a knee region 502 as well as in the linear region 501. The load line 503 forms an oval shape bulging downward through harmonic control. Since the overlap between voltage and current decreases in the load line 503, high efficiency characteristics are achieved.

This means that a saturated operation leading to high efficiency occurs due to the extension of the operation region of the saturated power amplification apparatus to the knee region.

Figure 6A:
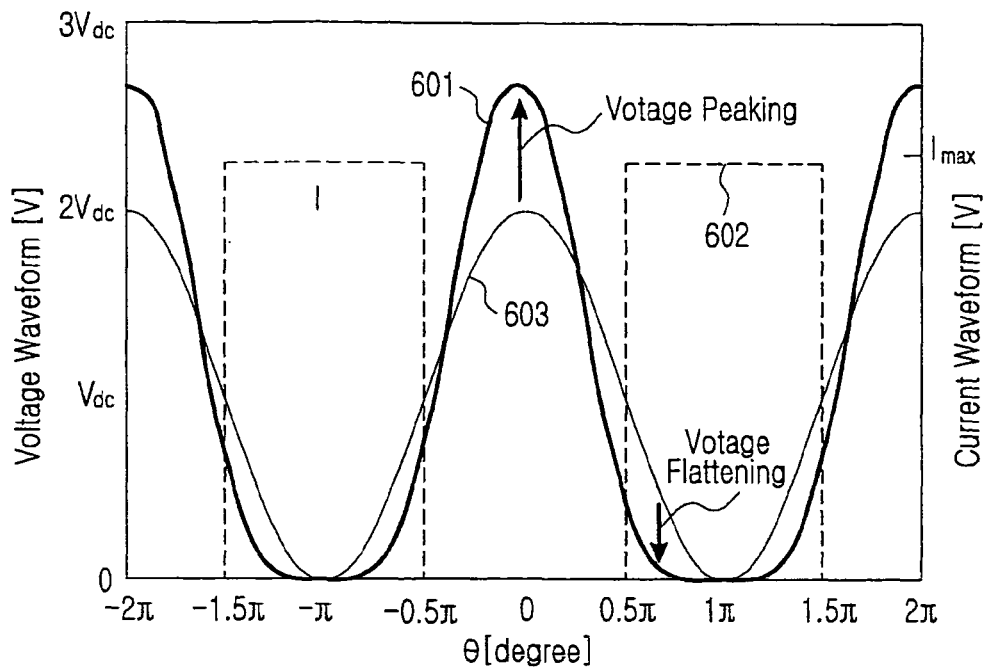
FIGS. 6A and 6B are graphs comparing the saturated power amplification apparatus with the conventional inverse Class-F power amplification apparatus, in terms of voltage waveform and current waveform, according to an exemplary embodiment of the present invention.
Figure 6B:
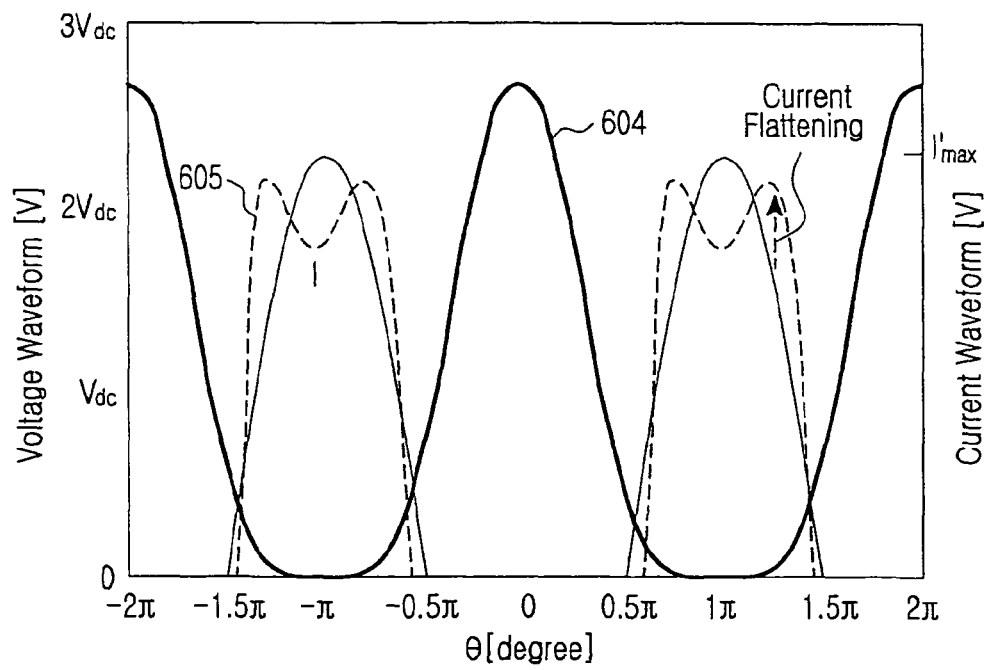

With reference to FIGS. 6A and 6B, the saturated power amplification apparatus of the present invention will be compared with the conventional inverse class-F power amplification apparatus in terms of voltage waveform and current waveform.

FIGS. 6A and 6B are graphs comparing the saturated power amplification apparatus of the present invention with the conventional inverse Class-F power amplification apparatus in terms of voltage waveform and current waveform. Specifically, FIG. 6A illustrates the voltage waveform and current waveform of the conventional inverse Class-F power amplification apparatus and FIG. 6B illustrates the voltage waveform and current waveform of the saturated power amplification apparatus of the present invention.

Regarding the conventional inverse Class-F power amplification apparatus, a voltage waveform 603 under a class-B bias is converted to a quasi half-sinusoidal voltage waveform 601 through harmonic control. In this case, a rectangular current waveform 602 is maintained because a second impedance and an even impedance are open.

The saturated power amplification apparatus of the present invention has a quasi half-sinusoidal voltage waveform 604 like the conventional inverse Class-F power amplification apparatus, and a quasi rectangular current waveform 605. The quasi rectangular current waveform 605 is attributed to the operation of the saturated power amplification apparatus in the knee region. As noted, the quasi rectangular current waveform 605 includes a large amount of high-order harmonic current which facilitates harmonic control. Therefore, the saturated power amplification apparatus can achieve high efficiency by use of a relatively simple circuit, compared to the conventional inverse Class-F power amplification apparatus.

The current of the saturated power amplification apparatus illustrated in FIG. 6B is given by Equation 10:

$$i_{DS}(\theta) = I_{DC} + I_1\cos(\theta + \alpha_1) + \sum_n I_n\cos(n\theta + \alpha_n). \quad \text{[Eqn. 10]}$$

In Equation 10, $i_{DS}(\theta)$ denotes the current waveform of a current source, $I_{DC}$ denotes a DC current, $I_1$ denotes the intensity of the fundamental-frequency current, $\alpha_1$ denotes the phase of the fundamental-frequency current, $I_n$ denotes the intensity of a harmonic current, and $\alpha_n$ denotes the phase of the harmonic current.

The voltage of the saturated power amplification apparatus illustrated in FIG. 6B can be expressed by Equation 11:

$$v_{DS}(\theta) = V_{DC} - V_1\cos(\theta + \beta_1) + \sum_n I_n\cos(n\theta + \beta_n). \quad \text{[Eqn. 11]}$$

In Equation 11, $v_{DS}(\theta)$ illustrates the voltage waveform of the current source, $V_{DC}$ denotes a DC voltage, $V_1$ denotes the magnitude of the fundamental-frequency voltage, $\beta_1$ denotes the phase of the fundamental-frequency voltage, $V_n$ denotes the magnitude of a harmonic voltage, and $\beta_n$ denotes the phase of the harmonic voltage.

Meanwhile, the voltages described as Equation 11 can be represented as the product between a current and a fundamental impedance and the product between a current and a harmonic impedance, as defined by Equations 12 and 13:

$$V_1 \triangleleft \beta_1 = Z_L(f_0) I_1 \triangleleft \alpha_1. \quad [\text{Eqn. 12}]$$

In Equation 12, $Z_L(f_0)$ denotes the fundamental impedance.

$$V_n \triangleleft \beta_n = Z_L(nf_0) I_n \triangleleft \alpha_n. \quad [\text{Eqn. 13}]$$

In Equation 13, $Z_L(nf_0)$ denotes the harmonic impedance.

As noted from Equation 12 and Equation 13, two methods are available to generate an appropriate fundamental-frequency voltage and an appropriate harmonic voltage. One is to control the fundamental impedance and the harmonic impedance and the other is to increase the fundamental-frequency current and the harmonic current, decreasing the fundamental impedance and the harmonic impedance. The appropriate fundamental-frequency voltage and the appropriate harmonic voltage refer to a fundamental-frequency voltage and a second harmonic voltage that are needed to generate a quasi sinusoidal voltage waveform. For instance, a ratio of about 0.3 between the fundamental-frequency voltage and the second harmonic voltage is required to maximize the fundamental-frequency voltage from the quasi-sinusoidal voltage waveform under the physical constraints of the knee voltage and breakdown voltage of the power device. The voltage waveform added with the second harmonic voltage is given by Equation 14:

$$V_{ds}(\vartheta) = V_{ds,DC} - V_{ds,1}\cos(\vartheta) - V_{ds,2}\cos(2\vartheta + \alpha) \quad [\text{Eqn. 14}]$$

$$V_{ds,norm}(\vartheta) = \frac{V_{ds}(\vartheta) - V_{ds,DC}}{V_{ds,1}}$$

$$= -\cos(\vartheta) - \frac{V_{ds,2}}{V_{ds,1}}\cos(2\vartheta)$$

$$= -\cos(\vartheta) - k_2\cos(2\vartheta)$$

where $k_2 = \frac{V_{ds,2}}{V_{ds,1}}$

In Equation 14, $\alpha$ denotes the phase difference between the fundamental-frequency voltage and the second harmonic voltage.

The addition of the appropriate second harmonic voltage in the power amplification apparatus helps to create a whole voltage waveform as a quasi half-sinusoidal voltage waveform, which will be described with reference to FIG. 7.

Figure 7:
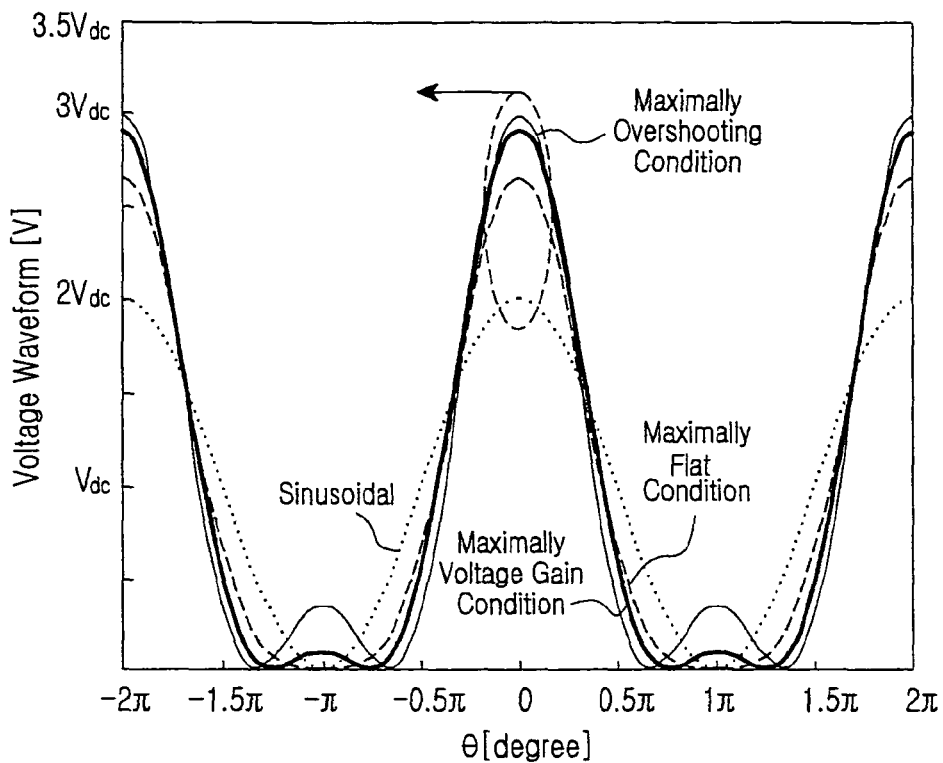
FIG. 7 is a graph illustrating a voltage waveform when a second harmonic voltage is added in a power amplification apparatus according to an exemplary embodiment of the present invention.

FIG. 7 is a graph illustrating a voltage waveform when a second harmonic voltage is added in a power amplification apparatus.

Referring to FIG. 7, the addition of the second harmonic voltage increases the amplitude of the voltage waveform of the fundamental frequency, which in turn increases the power of the power amplification apparatus. The voltage waveform depends on how the second harmonic voltage is added. Three main characteristic voltage waveforms are a maximally flat condition waveform, a maximum voltage gain condition waveform, and a maximum overshooting condition waveform. The conditions for generating these waveforms are listed in Table 1 below.

TABLE 1

| | $K_2 = |V_2|/|V_1|$ | $\delta = |V_{1,HM}|/|V_{1,TL}|$ | $\beta$ (overshooting) |
|---|---|---|---|
| Maximally flat condition | $-1/4$ | $4/3$ | $5/3$ |
| Maximum voltage gain condition | $-\sqrt{\frac{2}{4}}$ | $\sqrt{2}$ | 1.92 |
| Maximum overshooting condition | $-1/2$ | $4/3$ | 2 |

In Table 1, $K_2$ denotes the ratio between the magnitudes of the fundamental-frequency voltage and the second harmonic voltage and $\delta$ denotes the ratio between the magnitude of the fundamental-frequency voltage included in the voltage waveform added with the second harmonic voltage and the magnitude of the fundamental-frequency voltage without any harmonic voltage, i.e., with short impedances for all harmonics. $\beta$ denotes a peak value of a half-sinusoidal voltage waveform.

The maximally flat condition waveform is maximally flat at the bottom of a half-sinusoidal voltage waveform, the maximum voltage gain condition waveform has a maximum fundamental-frequency voltage, and the maximum overshooting condition waveform has a maximum peak of a half-sinusoidal voltage waveform.

Now a description will be made of the change of $\delta$ with respect to $\alpha$ and $K_2$ using Equation 14, with reference to FIG. 8.

Figure 8:
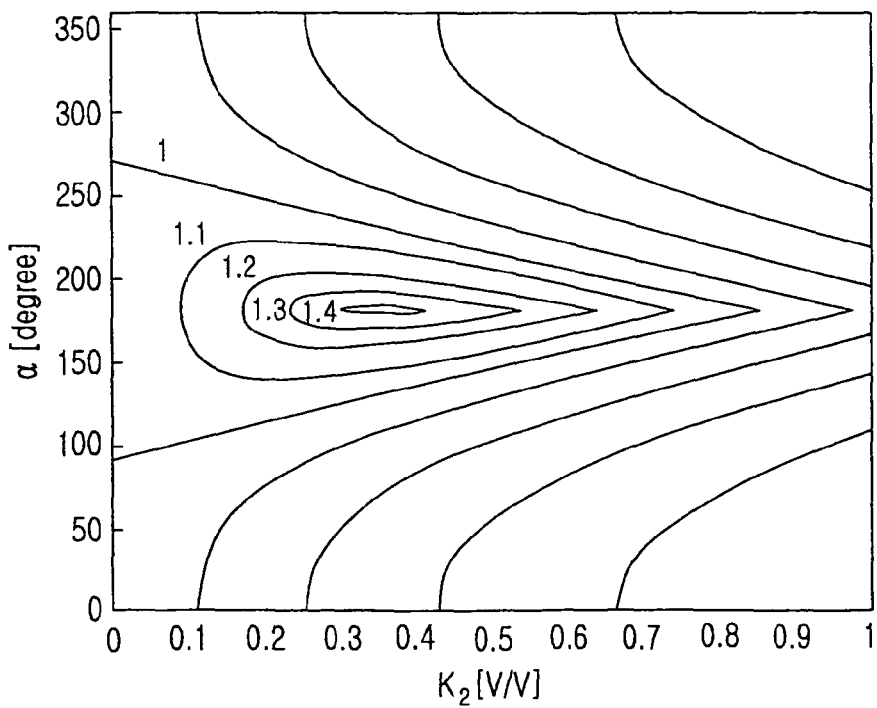
FIG. 8 is a graph illustrating a change in with respect to and in the power amplification apparatus according to an exemplary embodiment of the present invention.

FIG. 8 is a graph illustrating a change in $\delta$ with respect to $\alpha$ and $K_2$ in the power amplification apparatus.

Referring to FIG. 8, a maximum voltage gain of 1.414 is achieved when $\alpha=180°$ and $K_2=0.3535$.

To operate the saturated power amplification apparatus of the present invention in the knee region, a spontaneous harmonic current is generated by adjusting R and X of the complex impedance R+jX. In other words, R and X of the complex impedance R+jX are adjusted, for matching to the second harmonic in magnitude and in phase, as well.

The conventional high-efficiency power amplification apparatuses, for example, inverse Class-F ones achieve high efficiency by accurately controlling impedances in correspondence with harmonics in a linear region. However, a shortcoming with the conventional technologies is that the impedance control is difficult as the fundamental frequency increases and requires an additional circuit.

In contrast, the present invention provides a saturated power amplification apparatus that operates in the knee region as well as in the linear region. Therefore, the dependence of harmonic impedance is decreased without any additional circuit and high efficiency is achieved by use of the output capacitance of the power device and the complex load impedance.

Figure 9:
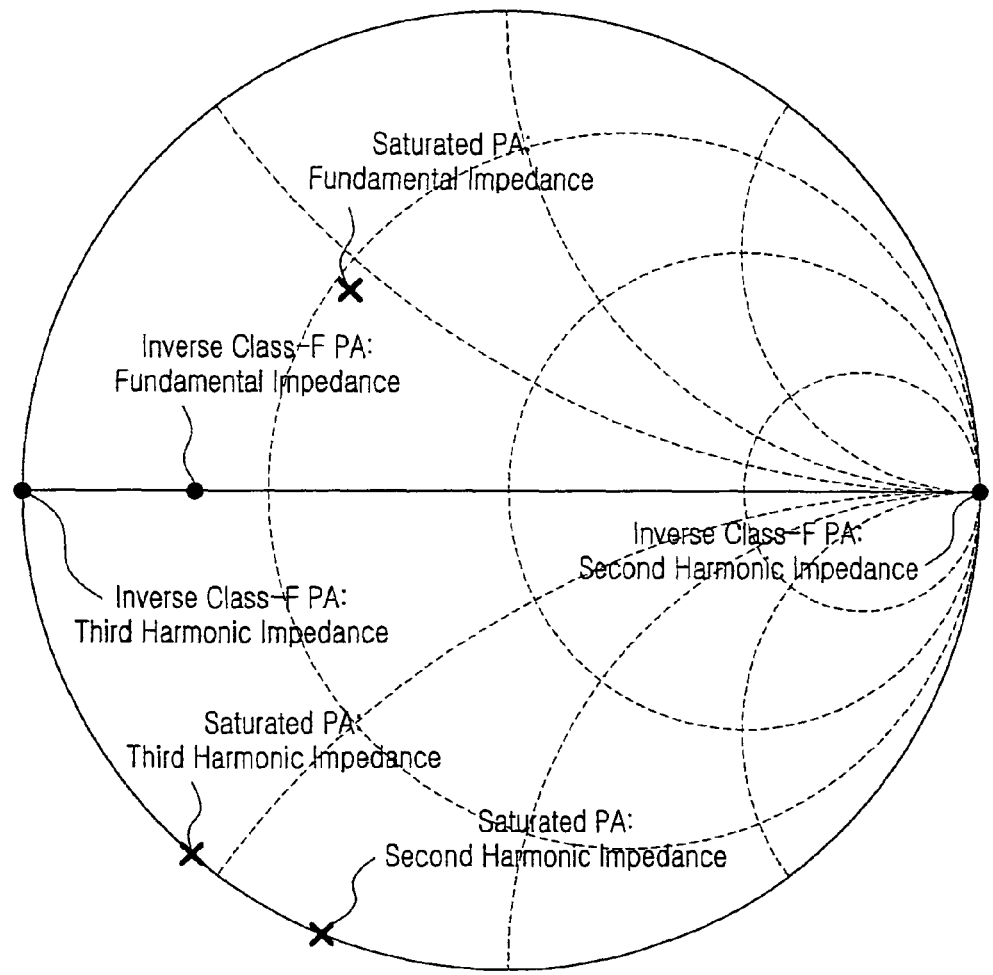
FIG. 9 is a Smith chart comparing the saturated power amplification apparatus with the conventional inverse Class-F power amplification apparatus, in terms of fundamental impedance and harmonic impedances, according to an exemplary embodiment of the present invention.

With reference to FIG. 9, the saturated power amplification apparatus will be compared with the conventional inverse Class-F power amplification apparatus in terms of fundamental frequency and harmonic impedances.

Referring to FIG. 9, Saturated PA represents the proposed saturated power amplification apparatus and Inverse Class-F PA represents the conventional inverse Class-F power amplification apparatus.

FIG. 9 is a Smith chart comparing the saturated power amplification apparatus of the present invention with the conventional inverse class-F power amplification apparatus in terms of fundamental frequency and harmonic impedances.

FIG. 9 shows the fundamental-frequency impedance (Inverse Class-F PA: Fundamental Impedance), second harmonic impedance (Inverse Class-F PA: Second Harmonic Impedance), and third harmonic impedance (Inverse Class-F PA: Third Harmonic Impedance) of the conventional inverse Class-F power amplification apparatus. As described above, the conventional inverse Class-F power amplification apparatus has only a purely resistive component for the fundamental frequency, open impedance for the second harmonic, and short impedance for the third harmonic.

In FIG. 9, there are also the fundamental-frequency impedance (Saturated PA: Fundamental Impedance), second harmonic impedance (Saturated PA: Second Harmonic Impedance), and third harmonic impedance (Saturated PA: Third Harmonic Impedance) of the proposed saturated power amplification apparatus. These impedances are those before the current source of the power device. Therefore, the saturated power amplification apparatus has a complex impedance for the fundamental frequency and output capacitance-incurred impedances for the second and third harmonics.

Figure 10:
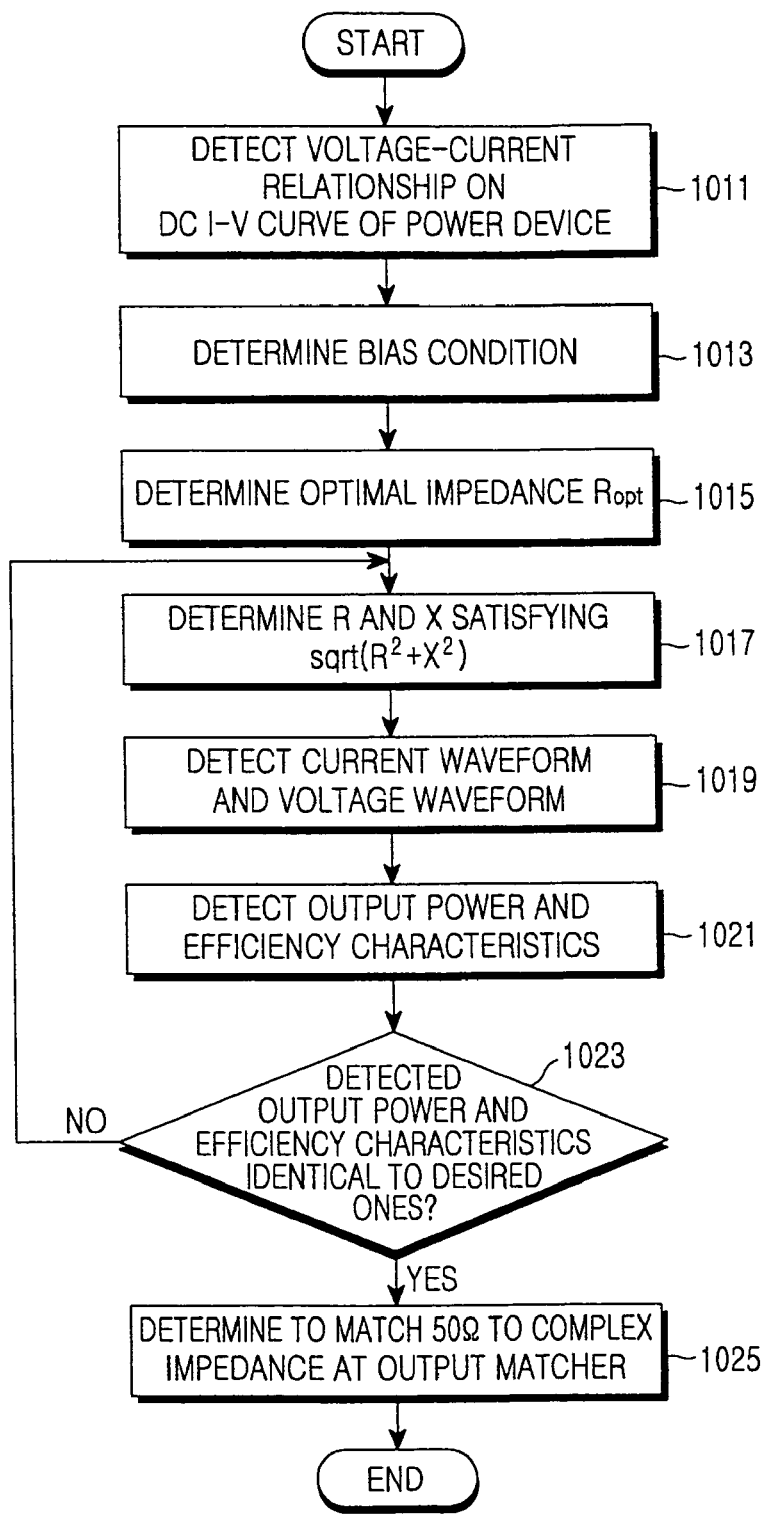
FIG. 10 is a flowchart illustrating an operation for determining a complex impedance in the saturated power amplification apparatus according to an exemplary embodiment of the present invention.

With reference to FIG. 10, an operation for determining the complex impedance R+jX in the saturated power amplification apparatus according to an exemplary embodiment of the present invention will be described.

FIG. 10 is a flowchart illustrating an operation for determining a complex impedance R+jX in the saturated power amplification apparatus according to an exemplary embodiment of the present invention.

Referring to FIG. 10, the saturated power amplification apparatus determines a voltage-current relationship from the DC I-V characteristic curve of the power device in step 1011 and determines a bias condition on which it will operate based on the voltage-current relationship in step 1013. In step 1015, the saturated power amplification apparatus determines an optimal impedance $R_{opt}$ according to the bias condition by Equation 1.

The saturated power amplification apparatus determines R and X satisfying $\text{sqrt}(R^2+X^2) > R_{opt}$ using the optimal impedance $R_{opt}$ in step 1017. In other words, the saturated power amplification apparatus determines a complex impedance R+jX. The saturated power amplification apparatus detects its current waveform and voltage waveform using the complex impedance R+jX and compares the detected current and voltage waveforms with desired current and voltage waveforms in step 1019. If the detected current and voltage waveforms are different from the desired current and voltage waveforms, the saturated power amplification apparatus returns to step 1017.

Since the current and voltage waveforms that can be acquired when using the detected complex impedance R+jX are not identical to the desired current and voltage waveforms, the saturated power amplification apparatus re-determines determines R and X to generate the desired current and voltage waveforms in step 1017.

In contrast, if the detected current and voltage waveforms are identical to the desired current and voltage waveforms, the saturated power amplification apparatus detects its output power and efficiency characteristics in step 1021. In step 1023, the saturated power amplification apparatus compares the detected output power and efficiency characteristics with desired output power and efficiency characteristics. If the detected output power and efficiency characteristics are different from the desired output power and efficiency characteristics, the saturated power amplification apparatus returns to step 1017.

Even though the current and voltage waveforms that can be acquired when using the detected complex impedance R+jX are identical to the desired current and voltage waveforms, the detected output power and efficiency characteristics are different from the desired output power and efficiency characteristics. Therefore, the saturated power amplification apparatus re-determines determines R and X to achieve the desired output power and efficiency characteristics in step 1017.

Conversely, if the detected output power and efficiency characteristics are identical to the desired output power and efficiency characteristics, the saturated power amplification apparatus determines to match 50 Ω with the complex impedance R+jX in the output matcher in step 1025.

While it has been described referring to FIG. 10 that the saturated power amplification apparatus determines the complex impedance R+jX, it is understood that it can use a complex impedance R+jX predetermined in the procedure of FIG. 10 without performing the determination operation.

Figure 11:
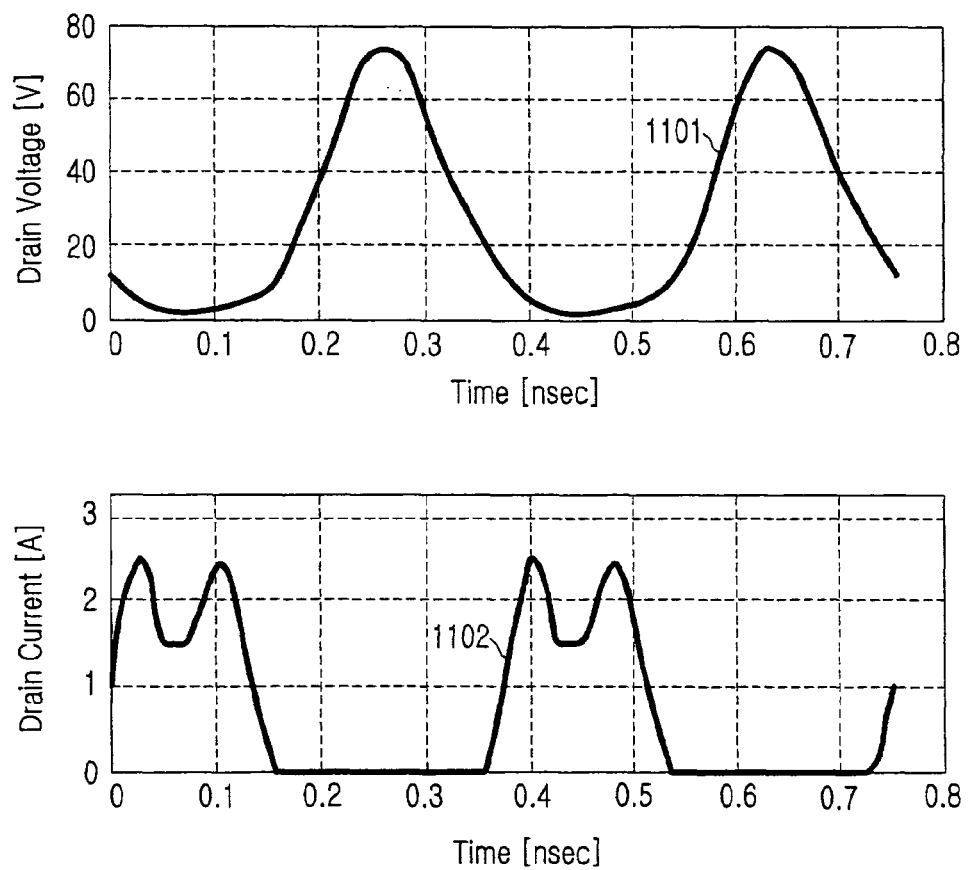
FIG. 11 is graphs illustrating the voltage waveform and current waveform of the saturated power amplification apparatus according to an exemplary embodiment of the present invention.

With reference to FIG. 11, the voltage waveform and current waveform of the saturated power amplification apparatus according to the present invention will be described.

FIG. 11 is graphs illustrating the voltage waveform and current waveform of the saturated power amplification apparatus according to the present invention.

Referring to FIG. 11, a voltage waveform 1101 of the saturated power amplification apparatus results from using impedances for the fundamental frequency and the harmonics, and a current waveform 1102 of the saturated power amplification apparatus is rectangular, incurred by spontaneous harmonics.

Figure 12:
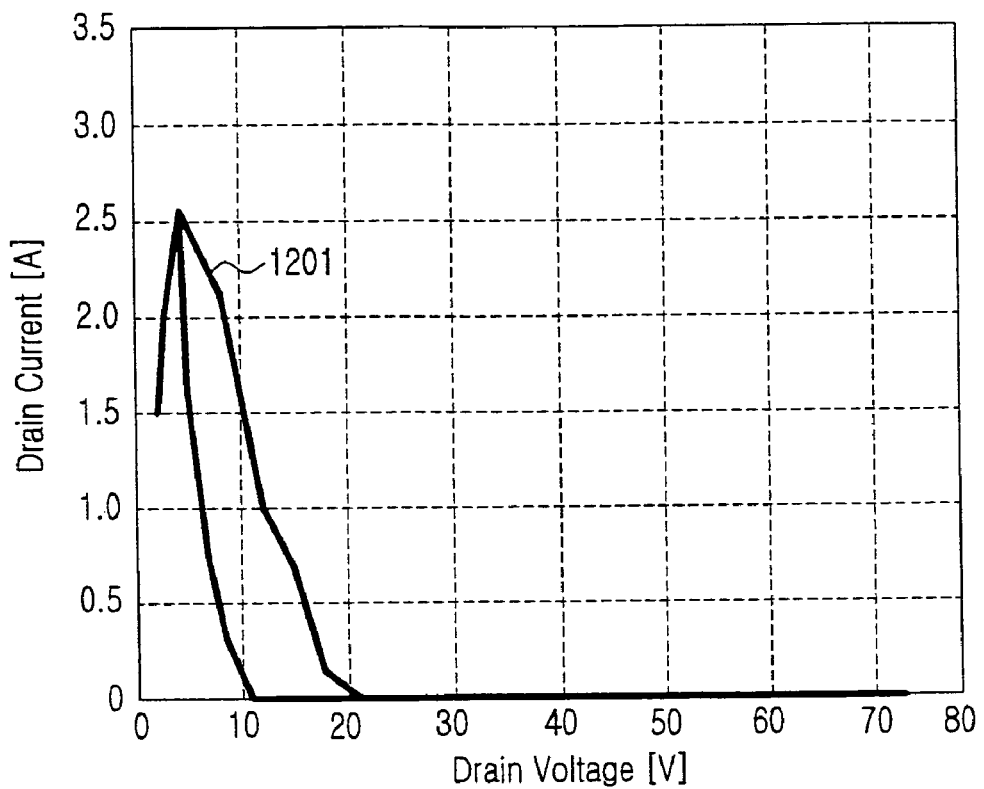
FIG. 12 is a graph illustrating the load line of the saturated power amplification apparatus according to an exemplary embodiment of the present invention.

With reference to FIG. 12, the load line of the saturated power amplification apparatus according to the present invention will be described below.

FIG. 12 is a graph illustrating the load line of the saturated power amplification apparatus according to the present invention.

When the saturated power amplification apparatus has the voltage and current waveforms illustrated in FIG. 11, it obtains the load line illustrated in FIG. 12. The load line along the knee region and is oval due to the complex impedance R+jX. The load line reveals that as the voltage waveform 1101 of FIG. 11 increases, voltage magnitude also increases.

Figure 13:
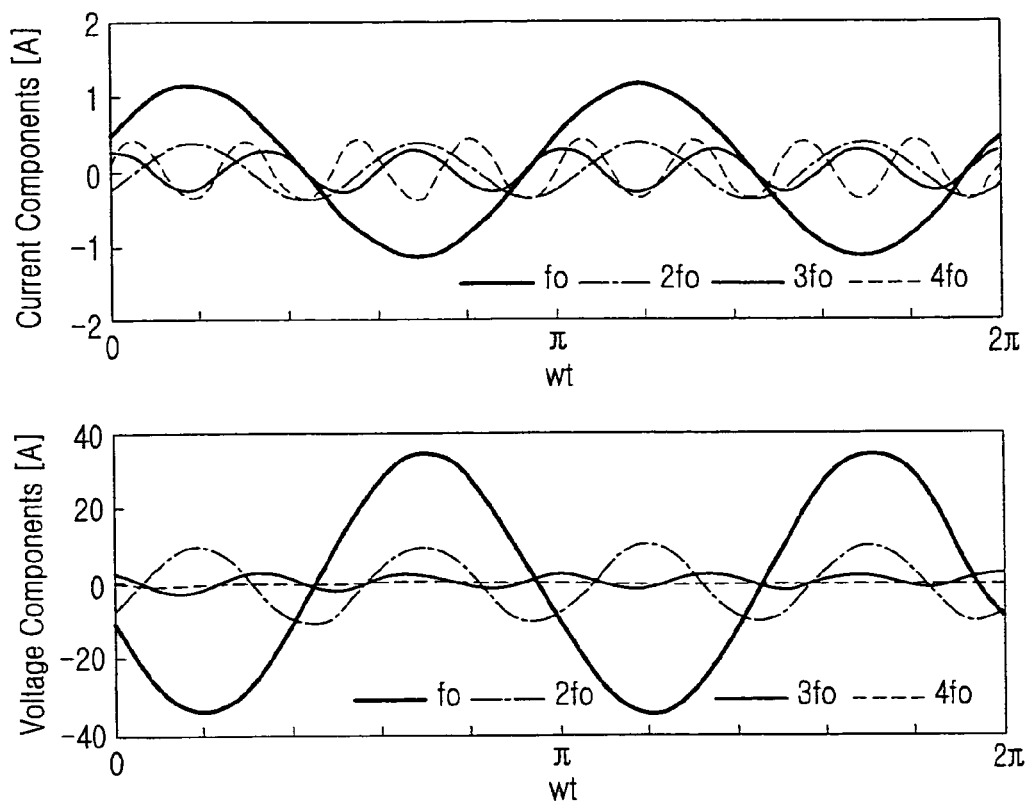
FIG. 13 is graphs illustrating the voltage waveforms and current waveforms of the saturated power amplification apparatus at a fundamental frequency and at a harmonic frequency according to an exemplary embodiment of the present invention.

With reference to FIG. 13, the voltage waveforms and current waveforms of the saturated power amplification apparatus according to the present invention at a fundamental frequency and at a harmonic frequency will be described.

FIG. 13 is graphs illustrating the voltage waveforms and current waveforms of the saturated power amplification apparatus according to the present invention at a fundamental frequency and at a harmonic frequency.

Referring to FIG. 13, it is noted that the current waveforms of the saturated power amplification apparatus have a large amount of second or high harmonic currents and the second and third harmonic voltages are controlled using output capacitance-incurred impedance resulting from the second or higher harmonic currents in order to generate a quasi half-sinusoidal voltage waveform. The illustrated rectangular current waveform is formed by third and fourth harmonic currents.

Compared to the conventional inverse Class-F power amplification apparatus, the voltage waveform of the saturated power amplification apparatus is not limited to the second harmonic voltage, rather it has considerable second or higher spontaneous harmonic voltages. Similarly, the current waveform of the saturated power amplification apparatus is not limited to the second harmonic current, rather it has considerable second or higher spontaneous harmonic currents. The existence of the second or higher spontaneous harmonic voltages and currents is attributed to the extension of the operation region of the saturated power amplification apparatus from the linear region to the knee region.

The existence of the second or higher spontaneous harmonic voltages and currents also implies that the saturated power amplification apparatus can generate desired second and third harmonic voltages/currents through fundamental frequency matching only without using an additional harmonic control circuit.

Figure 14:
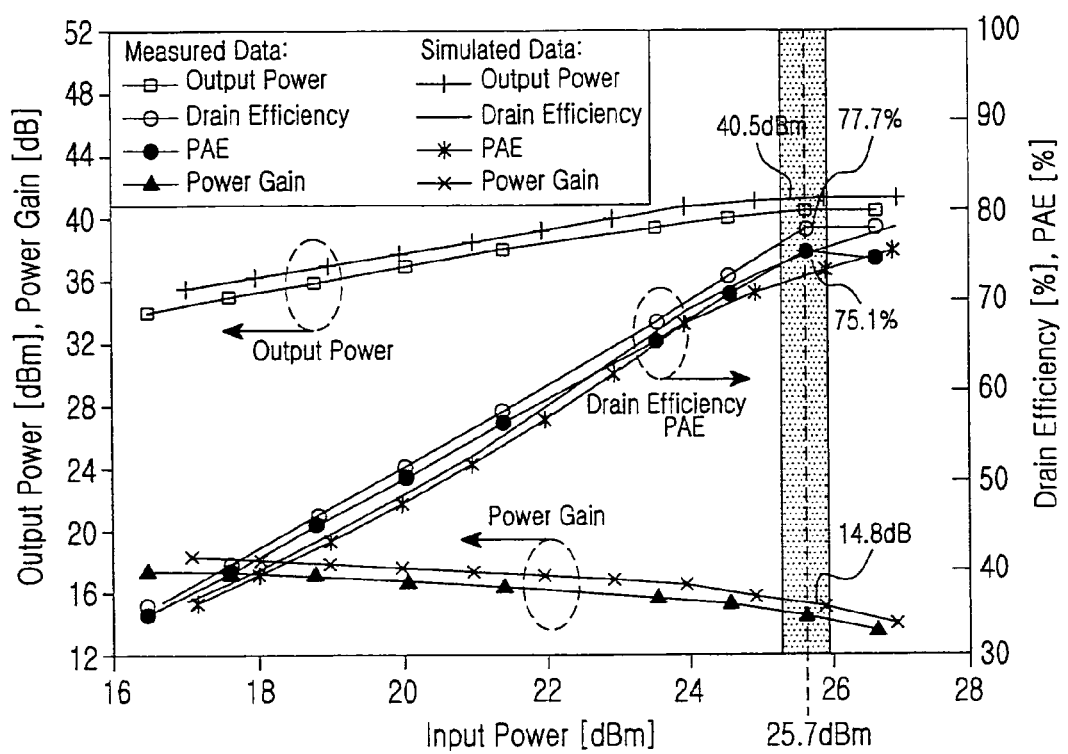
FIG. 14 is a graph illustrating the output power, drain efficiency, and Power Added Efficiency (PAE) of the saturated power amplification apparatus with respect to a Continuous Wave (CW) signal, according to an exemplary embodiment of the present invention.

With reference to FIG. 14, the output power, drain efficiency, and Power Added Efficiency (PAE) of the saturated power amplification apparatus according to the present invention with respect to a Continuous Wave (CW) signal will be described.

FIG. 14 is a graph illustrating the output power, drain efficiency, and PAE of the saturated power amplification apparatus according to the present invention with respect to a CW signal.

Referring to FIG. 14, the graph illustrates the output power, drain efficiency, and PAE with respect to the CW signal, when the saturated power amplification apparatus adopts, for example, a Cree CGH40010 device as a power device.

Also, the graph illustrates the output power, drain efficiency, and PAE with respect to the CW signal, when the saturated power amplification apparatus controls the fundamental-frequency impedance only to extend its operation region to the knee region without controlling second or higher harmonics.

As noted from FIG. 14, the saturated power amplification apparatus has a 77.7% drain efficiency and a 75.1% PAE at an output power level of 40.5 [dBm] in a fundamental frequency of 2.655 [GHz], achieving high efficiency. Further, the high efficiency is achieved without using an additional circuit for controlling second or higher harmonics.

As is apparent from the above description, the exemplary embodiments of the present invention can achieve high efficiency characteristics by enabling a high-efficiency power amplification apparatus to operate even in a knee region with use of a complex load impedance. That is, the present invention achieves high efficiency characteristics by extending the operation region of the high-efficiency power amplification apparatus to the knee region as well as a linear region.

The use of the complex load impedance leads to the high efficiency characteristics without using an additional circuit such as a harmonic control circuit.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A saturated power amplification apparatus comprising:
a power device; and
an output matcher configured to match a load impedance of the power device,
wherein the load impedance is a complex impedance exceeding an impedance generated during power matching in the saturated power amplification apparatus, and
wherein a phase of the complex impedance is determined so that the saturated power amplification apparatus can operate in both linear and knee regions on a DC I-V characteristic curve.

2. The saturated power amplification apparatus of claim 1, wherein the power device includes a current source and an output capacitor.

3. The saturated power amplification apparatus of claim 2, wherein a phase of the complex impedance is determined so that a phase difference between a second harmonic voltage generated through the output capacitor and a fundamental-frequency voltage generated by the complex impedance is a predetermined angle.

4. The saturated power amplification apparatus of claim 1, wherein the output matcher is configured to detect a voltage-current relationship from a DC I-V characteristic curve of the power device, determine a bias condition on which the saturated power amplification apparatus operates using the voltage-current relationship, and determine the load impedance using the bias condition.

5. A method for controlling a saturated power amplification apparatus comprising:
matching a load impedance of a power device,
wherein the load impedance is a complex impedance exceeding an impedance generated during power matching in the saturated power amplification apparatus, and
wherein a phase of the complex impedance is determined so that the saturated power amplification apparatus can operate in both linear and knee regions on a DC I-V characteristic curve.

6. The method of claim 5, wherein when the power device includes a current source and an output capacitor, a phase of the complex impedance is determined so that a phase difference between a second harmonic voltage generated through the output capacitor and a fundamental-frequency voltage generated by the complex impedance is a predetermined angle.

7. The method of claim 5, wherein the load impedance matching comprises:
detecting a voltage-current relationship from a DC I-V characteristic curve of the power device;
determining a bias condition on which the saturated power amplification apparatus operates using the voltage-current relationship; and
determining the load impedance using the bias condition.

8. The method of claim 5, wherein the complex impedance is further defined as a complex impedance R+jX with R and X having values such that sqrt($R^2+X^2$) is greater than an optimal impedance.

9. The method of claim 8 further comprising:
detecting a current waveform and a voltage waveform using the complex impedance; and
comparing the detected current and voltage waveforms with a desired current and voltage waveforms to determine whether the complex impedance needs to be re-determined.

10. A saturated power amplification apparatus comprising:
a power device having a current source and an output capacitor; and
an output matcher configured to match a load impedance of the power device,
wherein the load impedance is a complex impedance exceeding an impedance generated during power matching in the saturated power amplification apparatus, and
wherein a phase of the complex impedance is determined so that a phase difference between a second harmonic voltage generated through the output capacitor and a fundamental-frequency voltage generated by the complex impedance is a predetermined angle.

11. The saturated power amplification apparatus of claim 10, wherein a phase of the complex impedance is determined so that the saturated power amplification apparatus can operate in both linear and knee regions on a DC I-V characteristic curve.

12. The saturated power amplification apparatus of claim 10, wherein the output matcher is configured to detect a voltage-current relationship from a DC I-V characteristic curve of the power device, determine a bias condition on which the saturated power amplification apparatus operates using the voltage-current relationship, and determine the load impedance using the bias condition.

13. The saturated power amplification apparatus of claim 10, wherein the complex impedance is further defined as a complex impedance R+jX with R and X having values such that sqrt($R^2+X^2$) is greater than the load impedance.

14. The saturated power amplification apparatus of claim 13, wherein the saturated power amplification apparatus is configured to:
   detect a current waveform and a voltage waveform using the complex impedance; and
   compare the detected current and voltage waveforms with a desired current and voltage waveforms to determine whether the complex impedance needs to be re-determined.

15. A method for controlling a saturated power amplification apparatus comprising:
   matching a load impedance of a power device,
   wherein the load impedance is a complex impedance exceeding an impedance generated during power matching in the saturated power amplification apparatus, and
   wherein when the power device includes a current source and an output capacitor, a phase of the complex impedance is determined so that a phase difference between a second harmonic voltage generated through the output capacitor and a fundamental-frequency voltage generated by the complex impedance is a predetermined angle.

16. The method of claim 15, wherein a phase of the complex impedance is determined so that the saturated power amplification apparatus can operate in both linear and knee regions on a DC I-V characteristic curve.

17. The method of claim 15, wherein the load impedance matching comprises:
   detecting a voltage-current relationship from a DC I-V characteristic curve of the power device;
   determining a bias condition on which the saturated power amplification apparatus operates using the voltage-current relationship; and
   determining the load impedance using the bias condition.

18. The method of claim 15, wherein the complex impedance is further defined as a complex impedance R+jX with R and X having values such that sqrt($R^2+X^2$) is greater than the load impedance.

* * * * *